(12) United States Patent
Tanaka et al.

(10) Patent No.: US 6,441,317 B1
(45) Date of Patent: Aug. 27, 2002

(54) SEMICONDUCTOR MODULE AND INVERTER DEVICE

(75) Inventors: Akira Tanaka, Mito; Ryuichi Saito, Hitachi; Tadao Kushima, Tokai; Yoshihiko Koike, Hitachinaka; Hideo Shimizu, Mito; Shigeharu Nonoyama, Hitachi, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/654,085

(22) Filed: Sep. 1, 2000

(30) Foreign Application Priority Data

Nov. 4, 1999 (JP) .............................. 11-313331

(51) Int. Cl.⁷ ............................................. H05K 1/16
(52) U.S. Cl. ....................... 174/260; 174/255; 257/678; 361/796
(58) Field of Search ................ 174/260, 255, 174/256; 257/676, 693, 704, 701, 678; 361/752, 796, 772

(56) References Cited

U.S. PATENT DOCUMENTS

| | | | |
|---|---|---|---|
| 4,819,042 A | * | 4/1989 | Kaufman .................... 257/676 |
| 5,293,511 A | * | 3/1994 | Poradish et al. ............ 257/704 |
| 6,078,501 A | * | 6/2000 | Catambone et al. ........ 361/772 |
| 6,087,682 A | * | 7/2000 | Ando ......................... 257/704 |

FOREIGN PATENT DOCUMENTS

JP 4-172774 6/1992

OTHER PUBLICATIONS

Japanese Patent Unexamined Publication No. 8–111503.

* cited by examiner

*Primary Examiner*—Albert W. Paladini
(74) *Attorney, Agent, or Firm*—Antonelli, Terry, Stout & Kraus, LLP

(57) ABSTRACT

In a semiconductor module comprising, a semiconductor element, an electrically insulating base having an outer surface to be connected to an electrically grounded surface, and an inner surface on which the semiconductor element is arranged, an electrically insulating cover covering the semiconductor element on the inner surface, and first and second electrically conductive members each of which is connected to the semiconductor element and extends to the exterior of the semiconductor module through the electrically insulating cover, a part of each of the first and second electrically conductive members on the exterior of the semiconductor module is arranged away from the outer surface to electrically isolate the part of the each of the first and second electrically conductive members from the electrically grounded surface.

12 Claims, 13 Drawing Sheets

FIG. 6a
FIG. 6b
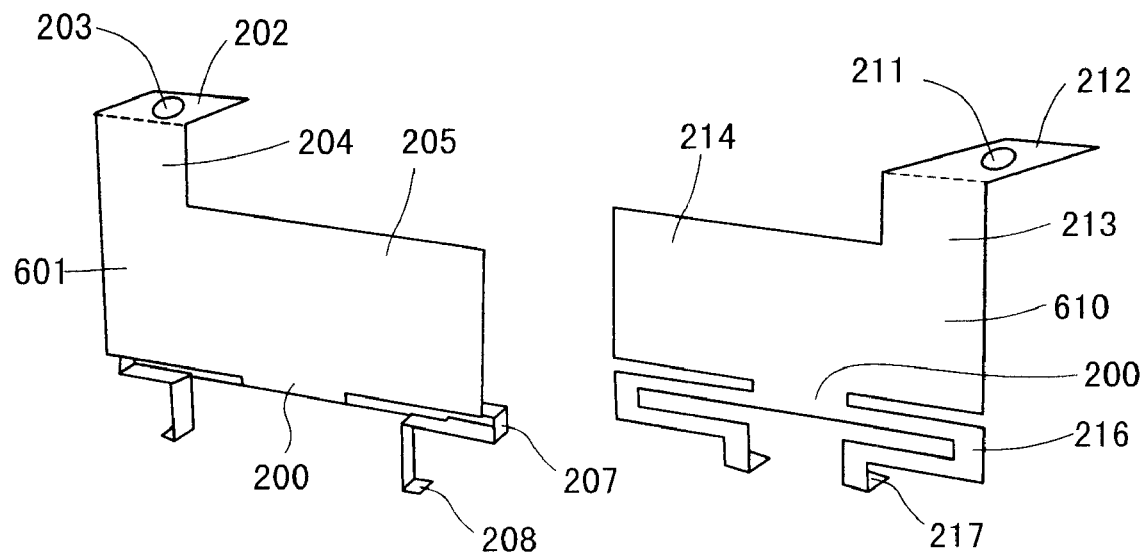
FIG. 6c
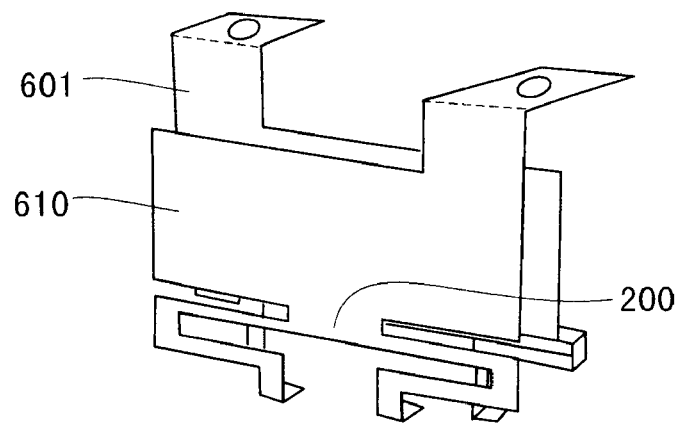

SEMICONDUCTOR MODULE AND INVERTER DEVICE

BACKGROUND OF THE INVENTION AND RELATED ART STATEMENT

The present invention relates to a semiconductor module including therein a semiconductor element, for example, a semiconductor transistor, thyristor and/or diode, and an inverter device including the semiconductor module.

JP-A-8-111503 discloses a semiconductor module including an electric insulating plate between an emitter terminal and a collector terminal.

OBJECT AND SUMMARY OF THE INVENTION

An object of the present invention is to provide a semiconductor module and an inverter device, by which an electrical insulation relative to an electrically grounded surface is reinforced, and an inductance between input and output terminals thereof is decreased.

A semiconductor module according to the invention, comprises, a semiconductor element, an electrically insulating base having an outer surface to be connected to an electrically grounded surface, and an inner surface on which the semiconductor element is arranged, an electrically insulating cover covering the semiconductor element on the inner surface, and first and second electrically conductive members each of which is connected to the semiconductor element and extends to the exterior of the semiconductor module through the electrically insulating cover, wherein a part of each of the first and second electrically conductive members on the exterior of the semiconductor module is arranged away from the outer surface to electrically isolate the part of the each of the first and second electrically conductive members from the electrically grounded surface. Therefore, an electrical insulation of the first and second electrically conductive members relative to the electrically grounded surface is securely kept.

When an electric current is supplied to the semiconductor element through the first electrically conductive member, and at least a part of the electric current is output from the semiconductor module through the second electrically conductive member, and the first and second electrically conductive members are arranged close to each other to form a mutual inductance therebetween, an inductance of the semiconductor module between the parts of the first and second electrically conductive members is decreased by the mutual inductance.

When a third electrically conductive member is connected to the semiconductor element and extends to the exterior of the semiconductor module through the electrically insulating cover, a value of electric current flowing through the third electrically conductive member is significantly smaller than a value of electric current flowing through the each of the first and second electrically conductive members, a part of the third electrically conductive member on the exterior of the semiconductor module is arranged away from the outer surface to electrically isolate the part of the third electrically conductive member from the electrically grounded surface, and a distance between the outer surface and the part of the third electrically conductive member is not less than 80% of a distance between the outer surface and the part of the each of the first and second electrically conductive members in a direction perpendicular to the outer surface, all of the parts of the first, second and third electrically conductive members are securely isolated electrically from the electrically grounded surface.

If a first electrically insulating spacer is inserted in jelly-state into a space between the semiconductor element and the electrically insulating cover and cured between the semiconductor element and the electrically insulating cover, and a second electrically insulating spacer is inserted in solid-state between areas of the first and second electrically conductive members facing close to each other to form a mutual inductance therebetween, the space complex in shape between the semiconductor element and the electrically insulating cover is securely filled by the first electrically insulating spacer in jelly-state cured after filling the space, and the areas of the first and second electrically conductive members facing close to each other to form the mutual inductance therebetween are securely isolated electrically from each other by the second electrically insulating spacer inserted in solid-state therebetween without voids of the first electrically insulating spacer in jelly-state. Between the second electrically insulating spacer and each or one of the areas of the first and second electrically conductive members, the first electrically insulating spacer in jelly-state may be inserted.

When at least one of the first and second electrically conductive members includes a first bent portion, a second bent portion and a third bent portion arranged in series while the second bent portion is arranged between the first and third bent portions in a current flow direction in which an electric current flows, the first, second and third bent portions are bent around respective axes parallel to each other and perpendicular to a thickness direction of the at least one of the first and second electrically conductive members at the first, second and third bent portions, and a portion of the at least one of the first and second electrically conductive members between the first and third bent portion is prevented from contacting with an electrically insulating member such as the electrically insulating cover, the cured first electrically insulating spacer and/or the electrically insulating base, the at least one of the first and second electrically conductive members is restrained effectively from generating a large stress caused by an undesirable deformation of the semiconductor module.

If the first and second electrically conductive members have respective relatively-wide portions facing close to each other, and a directional component of electric current in one of the relatively-wide portions is opposite to another directional component of electric current in another one of the relatively-wide portions, the mutual inductance is effectively increased. If the first and second electrically conductive members have respective relatively-narrow portions adjacent to the relatively-wide portions, and a cross-sectional area of each of the relatively-wide portions is larger than that of each of the relatively-narrow portions as seen in a current flow direction in which an electric current flows to concentrate the electric current to areas of the relatively-wide portions adjacent to the relatively-narrow portions, the mutual inductance is more effectively increased. If at least one of the first and second electrically conductive members is bent at the relatively-narrow portion around an axis perpendicular to a thickness direction of the at least one of the first and second electrically conductive members at the relatively-narrow portion, the mutual inductance is more effectively increased. The at least one of the first and second electrically conductive members may have at least two connecting feet each of which projects divergently from the relatively-narrow portion and is connected to the semiconductor element so that the mutual inductance is formed between the relatively-wide portion and the connecting foot both adjacent to the relatively-narrow portion. If the at least two connecting feet adjacent to the relatively-narrow portions extend substantially parallel to the part of each of the first and second electrically conductive members on the exterior of the semiconductor module, the mutual inductance is further increased. If a flowing direction of electric current is bent by the relatively-narrow portion of at least one of the first and second electrically conductive members to increase a length of electric current path between the part of the at least one of the first and second electrically conductive members and the semiconductor element and to make the flowing direction of electric current from the relatively-narrow portion and the flowing direction of electric current to the relatively-narrow portion opposite to each other, the mutual inductance is further increased. If one of the relatively-wide portions is bent to partially surround partially another one of the relatively-wide portions so that the one of the relatively-wide portions extends over or faces to both side surfaces of the another one of the relatively-wide portions, the mutual inductance is effectively increased.

As seen in a direction perpendicular to the outer surface, the relatively-wide portions may face to each other in a direction substantially perpendicular to an imaginary line extending between the parts of the first and second electrically conductive members on the exterior of the semiconductor module. A distance between the part of the third electrically conductive member and the part of the each of the first and second electrically conductive members in the direction parallel to the outer surface may be not less than 5 mm.

If both of the first and second electrically conductive members extend from the exterior of the semiconductor module toward the relatively-wide portions to flow respective electric currents obliquely to a direction perpendicular to the outer surface between the exterior of the semiconductor module and the relatively-wide portions, the electric currents crossing each other as seen in the thickness direction of the first and second electrically conductive members forms the mutual inductance therebetween.

A distance between the outer surface and the part of each of the first and third electrically conductive members may be less than a distance between the outer surface and the part the second electrically conductive members in a direction perpendicular to the outer surface.

According to the invention, an inverter device or semiconductor module assembly comprises a pair of first and second semiconductor modules each comprising, semiconductor elements, an electrically insulating base having an outer surface to be connected to an electrically grounded surface, and an inner surface on which the semiconductor element is arranged, an electrically insulating cover covering the semiconductor elements on the inner surface, and first and second terminal surfaces adapted to be contacted with a bus bar to form an electric communication between the semiconductor elements and the bus bar, wherein an electric current flows into the first and second terminal surfaces of the first semiconductor module from one of the bus bars, at least a part of the electric current flows out of the first and second terminal surfaces of the second semiconductor module into another one of the bus bars, the first and second terminal surfaces of the first semiconductor module and the first and second terminal surfaces of the second semiconductor module are arranged along a substantially straight imaginary line as seen in a direction perpendicular to the outer surfaces, and a height between the outer surface and an imaginary plane on which the first and second terminal surfaces of the first semiconductor module extend is different from a height between the outer surface and another imaginary plane on which the first and second terminal surfaces of the second semiconductor module extend as seen in a direction parallel to the outer surfaces, so that the bus bars can extend parallel to each other and face to each other to decrease an inductance of the bus bars by forming form a mutual inductance between the bus bars.

BRIEF DESCRIPTION OF THE DRAWINGS

FIG. 6a is an oblique projection view showing another emitter plate of the invention.

FIG. 6b is an oblique projection view showing another collector plate of the invention.

FIG. 6c is an oblique projection view showing the another emitter plate and the another collector plate combined with each other.

DETAILED DESCRIPTION OF PREFERRED EMBODIMENTS

Figure 1A:
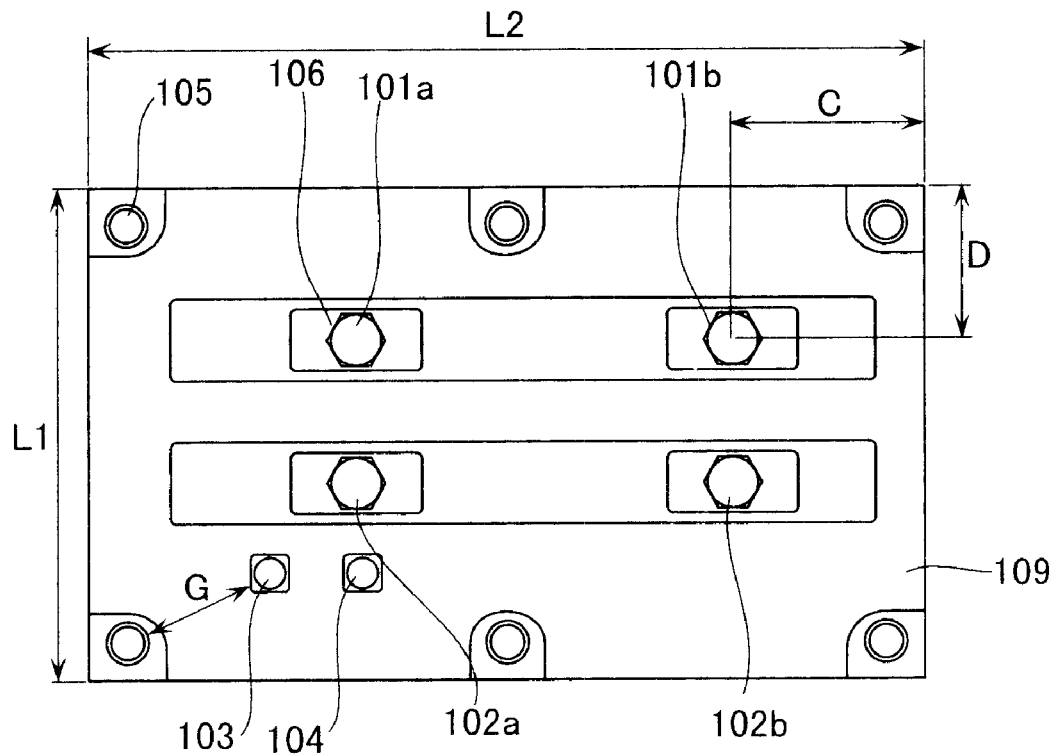
FIG. 1a is a front view showing a semiconductor module of the invention.
Figure 1B:
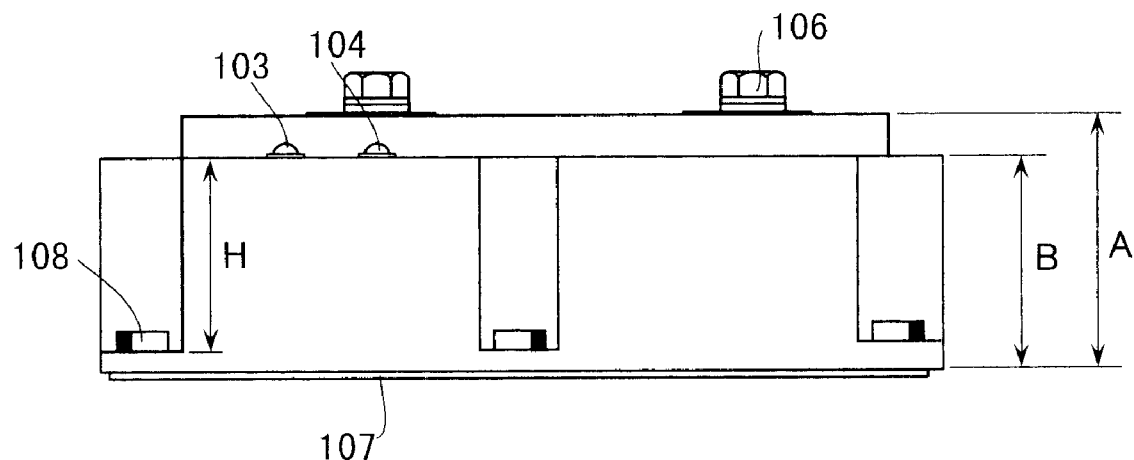
FIG. 1b is a side view showing the semiconductor module of the invention.

As shown in FIGS. 1a and 1b, on a semiconductor module 109 including a semiconductor transistor or thyristor or diode such as an insulated gate bipolar transistor or a gate turn off thyristor, collector terminals 101a and 101b are arranged along an imaginary straight line, and emitter terminals 102a and 102b are arranged along another imaginary straight line. Electric potential for the collector terminals 101a and 101b are different from electric potential for the emitter terminals 102a and 102b, and the collector terminals 101a and 101b and the emitter terminals 102a and 102b extend substantially on an imaginary plane. Ends of electrically conductive members or bus bars (not shown) whose other ends are connected to a main electric circuit are fixed respectively to the collector terminals 101a and 101b and the emitter terminals 102a and 102b by bolts 106. Since a number of the collector terminals 101a and 101b of the same electric potential and a number of the emitter terminals 102a and 102b of the same electric potential are even, lengths of the electrically conductive members connected respectively to the collector terminals 101a and 101b and the emitter terminals 102a and 102b may be equal to each other. Therefore, electric loads borne by semiconductor elements, more concretely, inductance values and/or resistance values of the electrically conductive members may be made equal to each other so that differences in electric noise value and/or electric current value among the electrically conductive members caused by differences in length among the electrically conductive members are minimized. An emitter supplemental terminal 103 and a gate terminal 104 are arranged on another imaginary straight line parallel to each of the before mentioned imaginary straight lines. The emitter supplemental terminal 103 and the gate terminal 104 extend on another imaginary plane on which another supplemental terminal such as a collector supplemental terminal (not shown) may extend. The semiconductor module 109 is fixed to a cooling fin by bolts (not shown) extending through two sets of bolt holes 105, each set of bolts 105 is arranged along another straight lines parallel to each of the before mentioned imaginary straight lines.

A distance C between a central position of each of the bolts 106 and a short side surface L1 is 41 mm, and a distance D between the central position of the each of the bolts 106 and a long side surface L2 is 40 mm. A difference between the distance C and the distance D is not more than 20% of the mean value of the distance C and the distance D. Since the distance C and the distance D are substantially equal to each other, any other semiconductor module may be freely arranged adjacent to the semiconductor module 109.

A distance A between a bottom surface 107a of a base 107 to be contacted with the electrically grounded cooling fin and the imaginary plane on which the collector terminals 101a and 101b and the emitter terminals 102a and 102b extend is 60 mm, and a distance B between the bottom surface 107a of the base 7 and the another imaginary plane on which the emitter supplemental terminal 103 and the gate terminal 104 extend is 49 mm, so that a difference between the distance A and the distance B is 11 mm more than 5 mm sufficient for separating or isolating electrically the electrically conductive members or bus bars connected to the collector terminals 101a and 101b and the emitter terminals 102a and 102b from electrically conductive wires connected to the emitter supplemental terminal 103 and the gate terminal 104 to enable the electrically conductive members or bus bars to be freely arranged without electric and positional interferences between the collector terminals 101a and 101b and the emitter terminals 102a and 102b and the emitter supplemental terminal 103 and the gate terminal 104. A distance between each of the imaginary planes and tops of the bolts extending into the electrically grounded cooling fin is more than a value limited by the IEC standard and the EN standard. Since the distance B is 82% of the distance A, the distance B is sufficiently large for forming a large space receiving electrically conductive elements extending respectively from the collector terminals 101a and 101b and the emitter terminals 102a and 102b.

A ratio of the distance A to an area value of the semiconductor module extending over the cooling fin (L1×L2) should be not less than 0.002 mm/mm². In this embodiment, the area value of the semiconductor module (L1×L2) is 26600 mm², and the distance A is 60 mm so that the ratio is 0.0026 mm/mm². Therefore, a creeping distance or length for insulation and a distance in a direction perpendicular to the bottom surface 107a of the base 7 between each of the collector terminals 101a and 101b and the emitter terminals 102a and 102b and the bottom surface 107a of the base 7 or the top of the bolts are sufficiently large relative to the area value of the semiconductor module (L1×L2) so that the semiconductor module can be used under the electric potential of D.C. 3000 V applied to the collector terminals 101a and 101b and the emitter terminals 102a and 102b.

| ratio of module height to module bottom area | insulating plate in module |
| --- | --- |
| 0.11 | breakable |
| 0.22 | non-breakable |

If the ratio of module height to the module bottom area is less than 0.2, a rigidity of the semiconductor module 109 is small and an insulating plate in the semiconductor module 109 is broken when the semiconductor module 109 is fixed onto the cooling plate. The semiconductor module 109 is usable if voltage of 9500 rms is applied to the semiconductor module 109 for one minute. The creeping distance or length for insulation not less than 50 mm enables the semiconductor module 109 to bear an abnormally high voltage of not less than 8000 V generated by, for example, thunder.

Figure 2A:
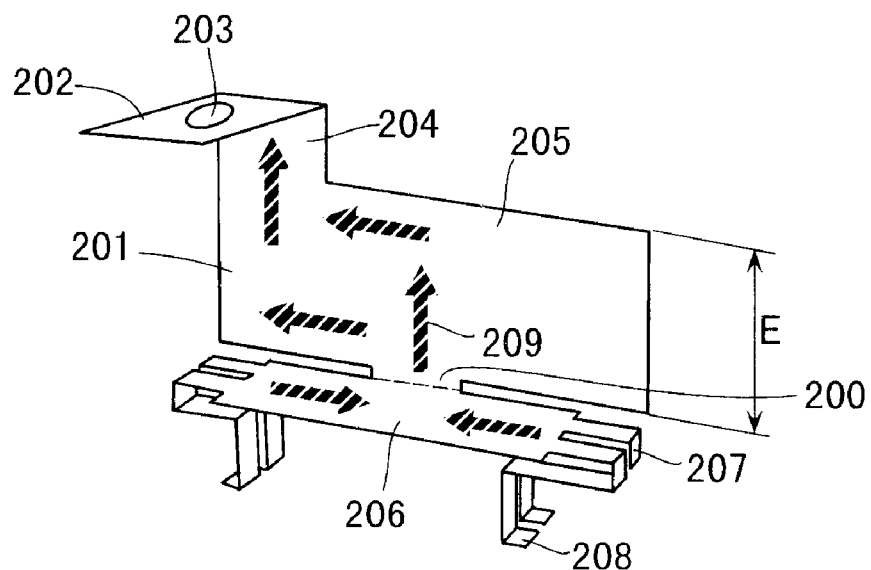
FIG. 2a is an oblique projection view showing an emitter plate of the invention.
Figure 2B:
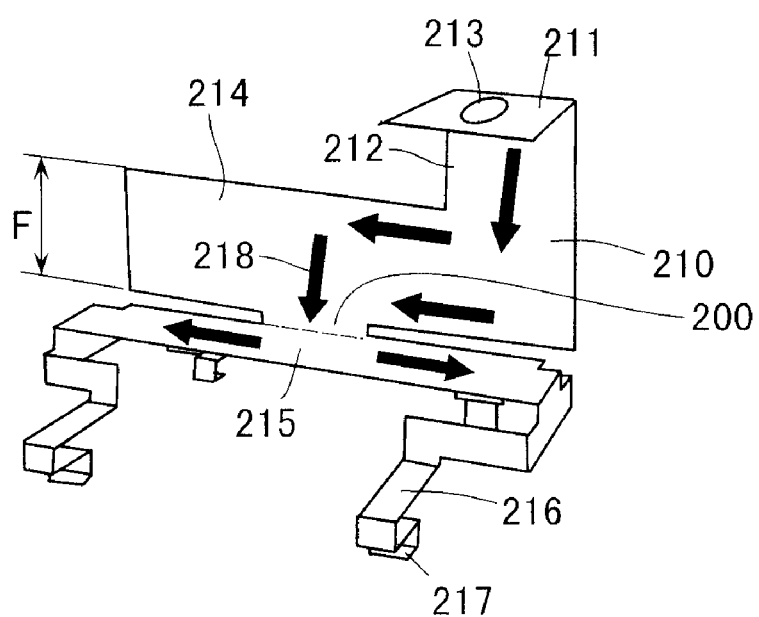
FIG. 2b is an oblique projection view showing a collector plate of the invention.

As shown in FIGS. 2a and 2b, an emitter plate 201, 501, 601, 801 has an emitter terminal surface 202 (corresponding to the emitter terminals 102a and 102b) to be exposed and to be connected to the bus bar and a hole 203 into which the bolt 106 is inserted. A collector plate 210, 510, 610, 810 has a collector terminal surface 211 (corresponding to the collector terminals 101a and 101b) to be exposed and to be connected to the bus bar and a hole 212 into which the bolt 106 is inserted. Emitter connectors 208 are connected to an emitter electrically conductive pattern (not shown) of Cu, Al or Mo on a ceramic substrate (not shown) fixed to the base 107. Bent portion 207, 216 decrease a stress of the emitter connectors 208 when the semiconductor module 109 is deformed by a thermal load. Collector connectors 217 are connected to a collector electrically conductive pattern (not shown) of Cu, Al or Mo on another ceramic substrate (not shown) fixed to the base 107. Bent portion 216 decrease a stress of the collector connectors 217 when the semiconductor module 109 is deformed by the thermal load.

In a pair of the emitter plate 201, 501, 601, 801 and the collector plate 210, 510, 610, 810 which extend parallel to each other and flow respective electric currents (at least parts or components thereof) opposite to each other, an inductance of a combination of the emitter plate 201, 501, 601, 801 and the collector plate 210, 510, 610, 810=(a sum of self-inductances of the emitter plate 201, 501, 601, 801 and the collector plate 210, 510, 610, 810–a mutual inductance of the emitter plate 201, 501, 601, 801 and the collector plate 210, 510, 610, 810. The mutual inductance is generated between areas facing closely to each other (for example, with a distance of about 2 mm) and flowing respectively the electric currents (at least parts or components thereof) opposite to each other. The smaller a distance between a wide area 214 of the collector plate 210, 510, 610, 810 and a wide area 205 of the emitter plate 201, 501, 601, 801 facing to each other is while an electric insulation therebetween is maintained, the larger the mutual inductance between the emitter plate 201, 501, 601, 801 and the collector plate 210, 510, 610, 810 is. The larger the mutual inductance between the emitter plate 201, 501, 601, 801 and the collector plate 210, 510, 610, 810 is, the smaller the inductance of the combination of the emitter plate 201, 501, 601, 801 and the collector plate 210, 510, 610, 810 is.

In the collector plate 210, 510, 610, 810, the electric current flows from the collector terminal surface 211 to the collector connectors 217 through a portion 213, the wide area 214, a diverging portion 215 and the bent portion 216 as shown by an arrow 218. In the emitter plate 201, 501, 601, 801, the electric current flows from the emitter connectors 208 to the emitter terminal surface 202 through the bent portion 207, 216, a diverging portion 206, the wide area 205 and a portion 204 as shown by an arrow 209.

The larger an overlapping area at which at least a part of the wide area 214 of the collector plate 210, 510, 610, 810 and at least a part of the wide area 205 of the emitter plate 201, 501, 601, 801 face closely to each other is, the larger the mutual inductance between the emitter plate 201, 501, 601, 801 and the collector plate 210, 510, 610, 810 is. Since a distance between the imaginary plane on which the emitter supplemental terminal 103 and the gate terminal 104 extend and the bottom surface 107a of the base 107 to be contacted with the electrically grounded cooling fin is not less than 80% of a distance between the imaginary plane on which the collector terminal surface 211 (corresponding to the collector terminals 101a and 101b) and the emitter terminal surface 202 (corresponding to the emitter terminals 102a and 102b) and the bottom surface 107a of the base 107, a length E of the wide area 205 and a length F of the wide area 214 are not less than 20 mm so that the overlapping area at which the wide area 214 of the collector plate 210, 510, 610, 810 and the wide area 205 of the emitter plate 201, 501, 601, 801 face closely to each other is sufficiently large for decreasing the inductance of the combination of the emitter plate 201, 501, 601, 801 and the collector plate 210, 510, 610, 810 to 70% of the sum of self-inductances of the emitter plate 201, 501, 601, 801 and the collector plate 210, 510, 610, 810.

Figure 3:
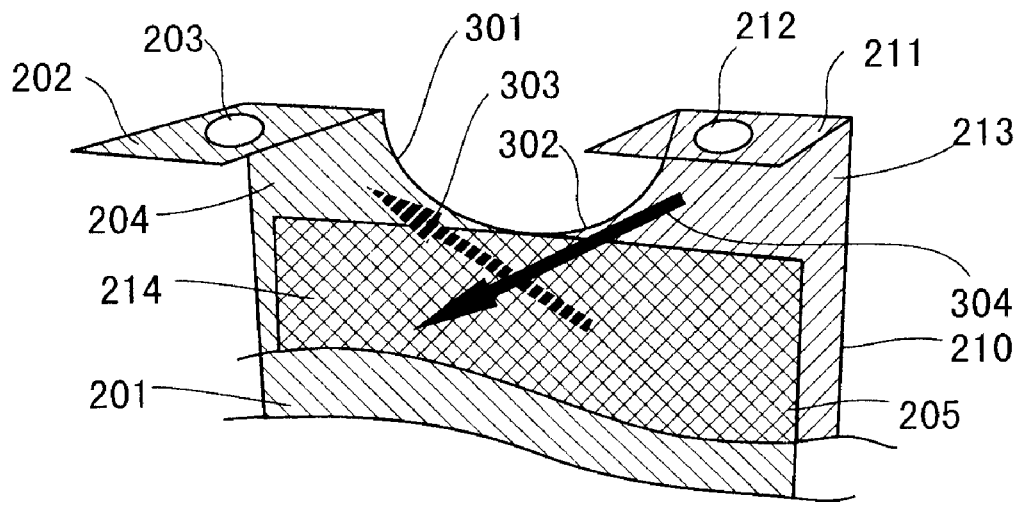
FIG. 3 is an oblique projection view showing modified emitter and collector plates of the invention.

For further decreasing the inductance of the combination of the emitter plate 201, 501, 601, 801 and the collector plate 210, 510, 610, 810, the portion 204 and the portion 213 may have respective curved outer edges facing to each other as shown in FIG. 3, so that an electric current 304 from the collector terminal surface 211 and an electric current 303 toward the emitter terminal surface 202 are crossed as seen in a thickness direction of the portion 204 and the portion 213 to prevent the electric current 304 and the electric current 303 from flowing in the same direction to increase the inductance of the combination of the emitter plate 201, 501, 601, 801 and the collector plate 210, 510, 610, 810.

Figure 4:
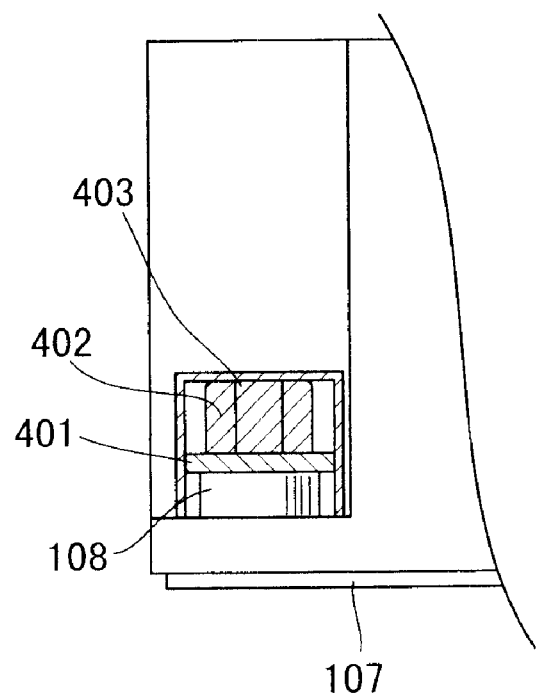
FIG. 4 is a partially cross-sectional view showing a structure for fixing the semiconductor module onto an electrically grounded surface.

As shown in FIG. 4, the semiconductor module 109 is fixed to the electrically grounded cooling fin (not shown) by bolts 402 and washers 401. The bolts 402 extends through the holes 105 and are covered by caps 403 of electrically insulating resin to electrically insulate the electrically grounded bolts 402 from the collector plate 210, 510, 610, 810 and the emitter plate 201, 501, 601, 801, so that a minimum insulating distance is formed between the electrically grounded cooling fin and the collector plate 210, 510, 610, 810 and the emitter plate 201, 501, 601, 801.

Figure 5A:
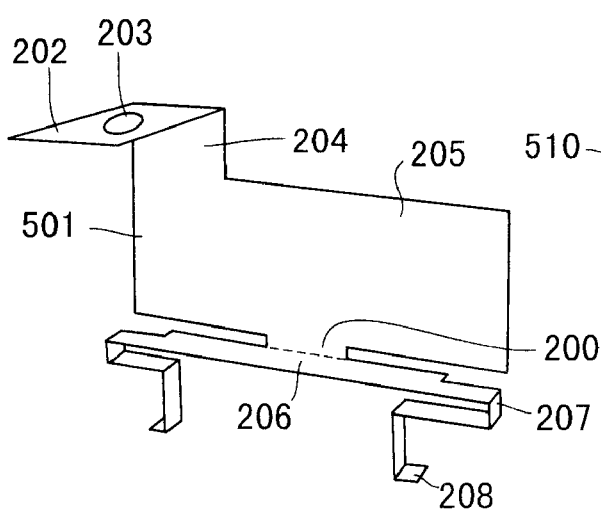
FIG. 5a is an oblique projection view showing another emitter plate of the invention.
Figure 5B:
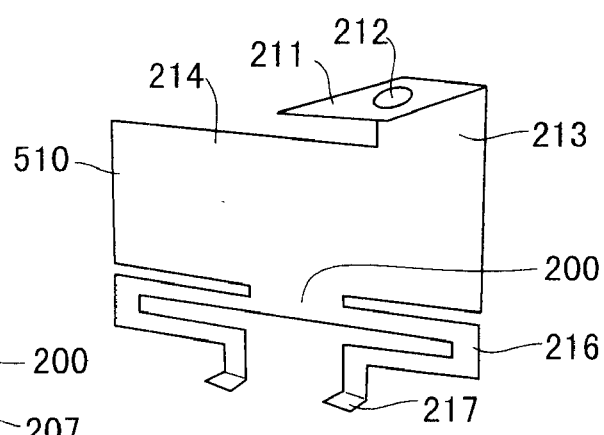
FIG. 5b is an oblique projection view showing another collector plate of the invention.
Figure 5C:
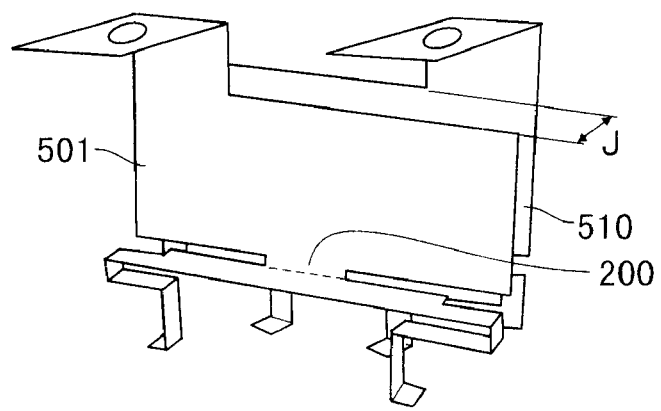
FIG. 5c is an oblique projection view showing the another emitter plate and the another collector plate combined with each other.

As shown in FIGS. 5a, 5b and 5c, an emitter plate 501 has the emitter terminal surface 202 (corresponding to the emitter terminals 102a and 102b) to be exposed and to be connected to the bus bar, the portion 204, the wide area 205, the diverging portion 206, the bent portion 207, 216, the emitter connectors 208 and the hole 203 into which the bolt 106 is inserted. A collector plate 510 has the collector terminal surface 211 (corresponding to the collector terminals 101a and 101b) to be exposed and to be connected to the bus bar, the portion 213, the wide area 214, the bent portion 216, the collector connectors 217 and the hole 212 into which the bolt 106 is inserted. A distance between the wide area 205 and the wide area 214 is about 5 mm. As shown in FIGS. 6a, 6b and 6c, an emitter plate 601 has the emitter terminal surface 202 (corresponding to the emitter terminals 102a and 102b) to be exposed and to be connected to the bus bar, the portion 204, the wide area 205, the diverging portion 206, the bent portion 207, 216, the emitter connectors 208 and the hole 203 into which the bolt 106 is inserted. A collector plate 610 has the collector terminal surface 211 (corresponding to the collector terminals 101a and 101b) to be exposed and to be connected to the bus bar, the portion 213, the wide area 214, the bent portion 216, the collector connectors 217 and the hole 212 into which the bolt 106 is inserted. A distance between the wide area 205 and the wide area 214 is about 5 mm.

Figure 7:
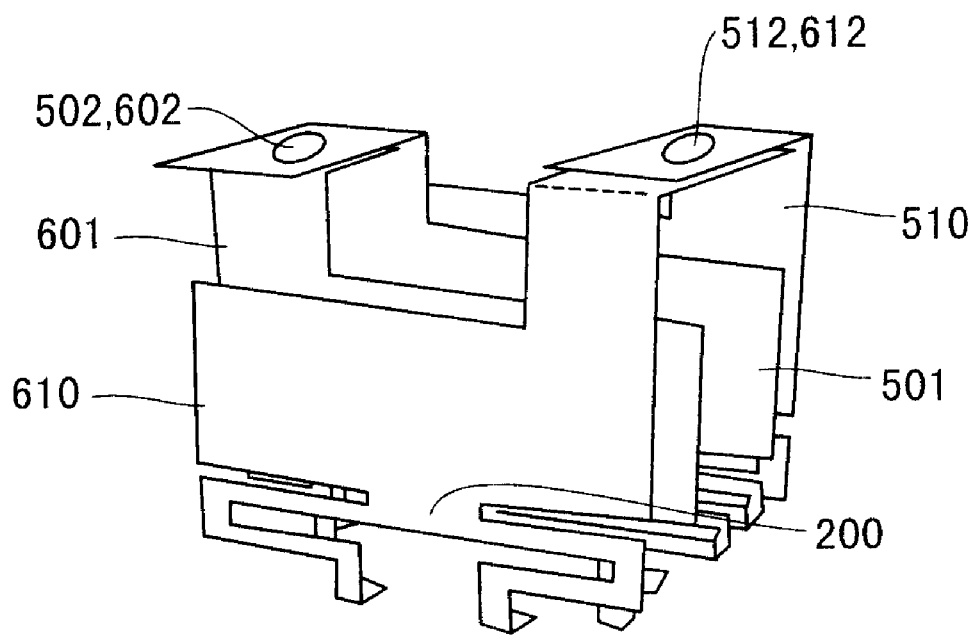
FIG. 7 is an oblique projection view showing another combination of another emitter plate and another collector plate.

As shown in FIG. 7, the emitter plate 501 and the emitter plate 601 are combined, and the collector plate 510 and the collector plate 610 are combined while the holes 202 of the emitter plate 501 and the emitter plate 601 are aligned with each other and the holes 212 of the collector plate 510 and the collector plate 610 are aligned with each other to be substituted for the emitter plate 201, 501, 601, 801 and the collector plate 210, 510, 610, 810. The inductance of the combination of the collector plate 510 and the collector plate 610 is about a half of the inductance of the combination of the emitter plate 201, 501, 601, 801 and the collector plate 210, 510, 610, 810.

Figure 8:
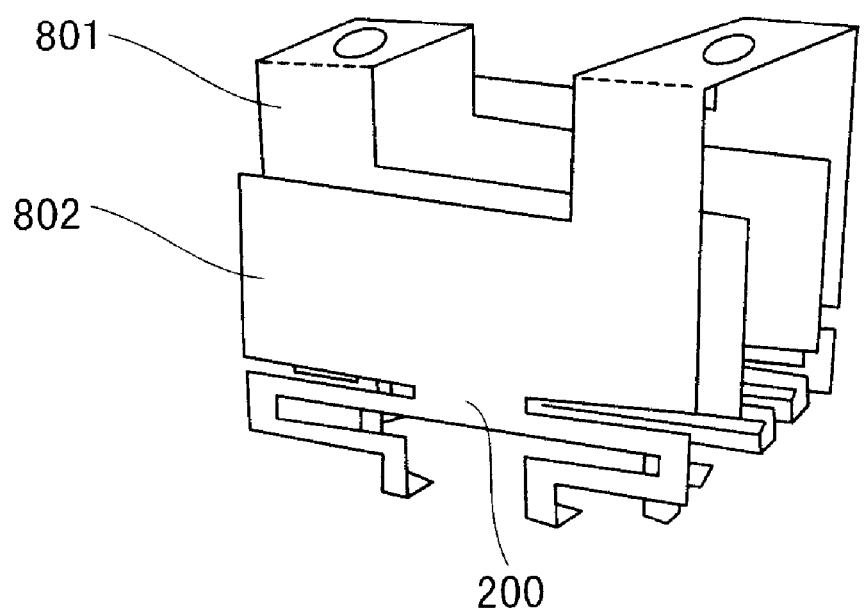
FIG. 8 is an oblique projection view showing another combination of another emitter plate and another collector plate.

As shown in FIG. 8, the emitter plate 501 and the emitter plate 601 may be replaced by a monolithic emitter plate 801, and the collector plate 510 and the collector plate 610 may be replaced by a monolithic collector plate 802.

Figure 9A:
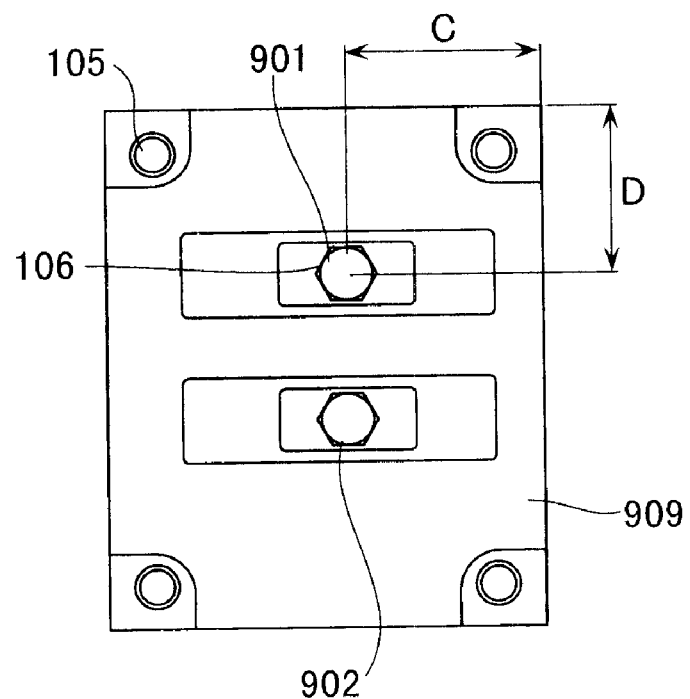
FIG. 9a is a front view showing another semiconductor module of the invention.
Figure 9B:
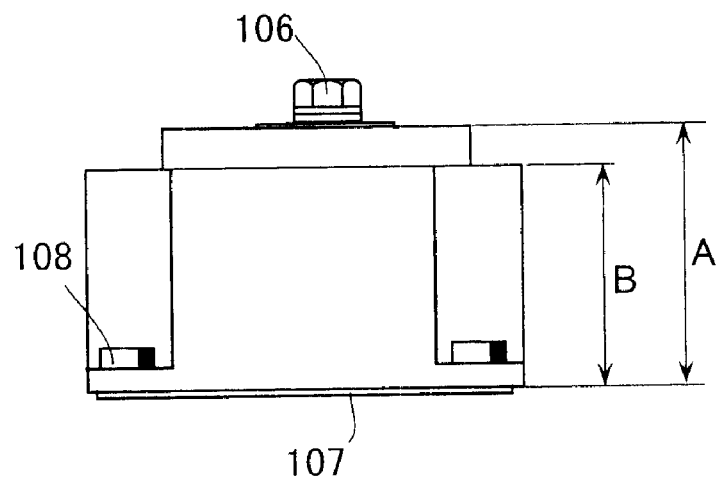
FIG. 9b is a side view showing the another semiconductor module of the invention.

In a semiconductor module 909 including a diode as shown in FIGS. 9a and 9b, a difference between a distance C between a central position of each of the bolts 106 for an anode terminal 901 or a cathode terminal 902 and a short side surface of the semiconductor module 909, and a distance D between the central position of the each of the bolts 106 and a long side surface L2 of the semiconductor module 909 is not more than 20% of the mean value of the distance C and the distance D. Since the distance C and the distance D are substantially equal to each other, any other semiconductor module may be freely arranged adjacent to the semiconductor module 109. A distance A between the bottom surface 107a of the base 107 to be contacted with the electrically grounded cooling fin and the imaginary plane on which the anode terminal 901 and the cathode terminal 902 extend is 60 mm, and a distance B between the bottom surface 107a of the base 7 and a lower plane extend is 49 mm, so that the semiconductor module 909 has two outer planes of the distances A and B corresponding to the distances A and B of the semiconductor module 109.

Figures 10A, 10B:
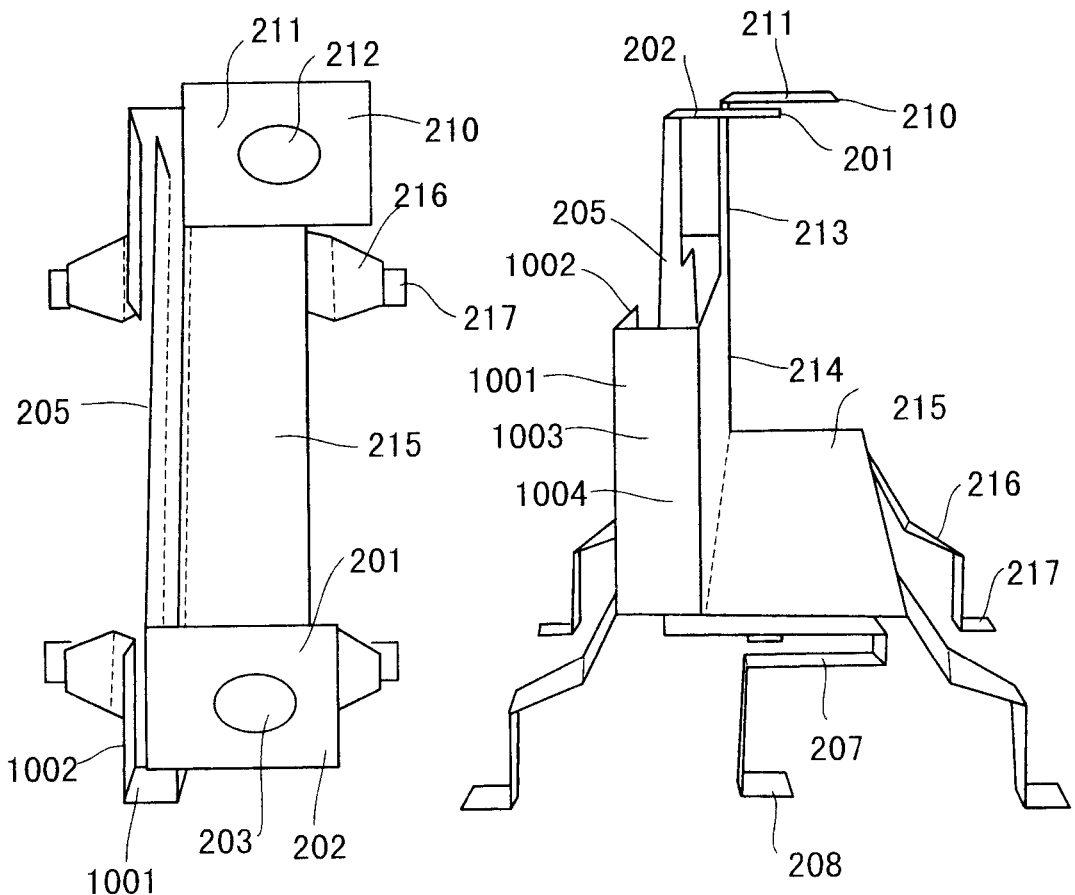
FIG. 10a is a front view showing another combination of another emitter plate and another collector plate.
FIG. 10b is an oblique projection view showing the another combination of the another emitter plate and the another collector plate.
Figure 10C:
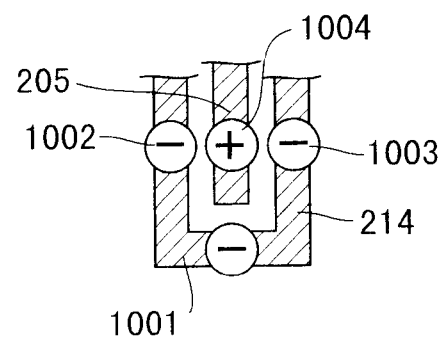
FIG. 10c is a cross-sectional view showing a wide area of the another emitter plate partially surrounded by a wide area of the another collector late.

As shown in FIGS. 10a, 10b and 10c, in the collector terminal plate 210, 510, 610, 810, the electric current flows from the collector terminal surface 211 in a direction shown by an arrow 1003 through a collector side cover portion 1001 and a collector reverse side cover portion 1002. In the emitter terminal plate 201, 501, 601, 801, the electric current flows toward the emitter terminal surface 202 in a direction shown by an arrow 1004 through the emitter connectors 208, the bent portion 207, 216 and the wide area 205. Since the collector side cover portion 1001 and the collector reverse side cover portion 1002 of the wide area 214 face closely to the wide area 205 and the direction shown by the arrow 1003 is opposite to the direction shown by the arrow 1004, the mutual inductance of the emitter plate 201, 501, 601, 801 and the collector plate 210, 510, 610, 810 is increased to decrease the inductance of the combination of the emitter plate 201, 501, 601, 801 and the collector plate 210, 510, 610, 810 to 60% of the sum of self-inductances of the emitter plate 201, 501, 601, 801 and the collector plate 210, 510, 610, 810.

Figure 11:
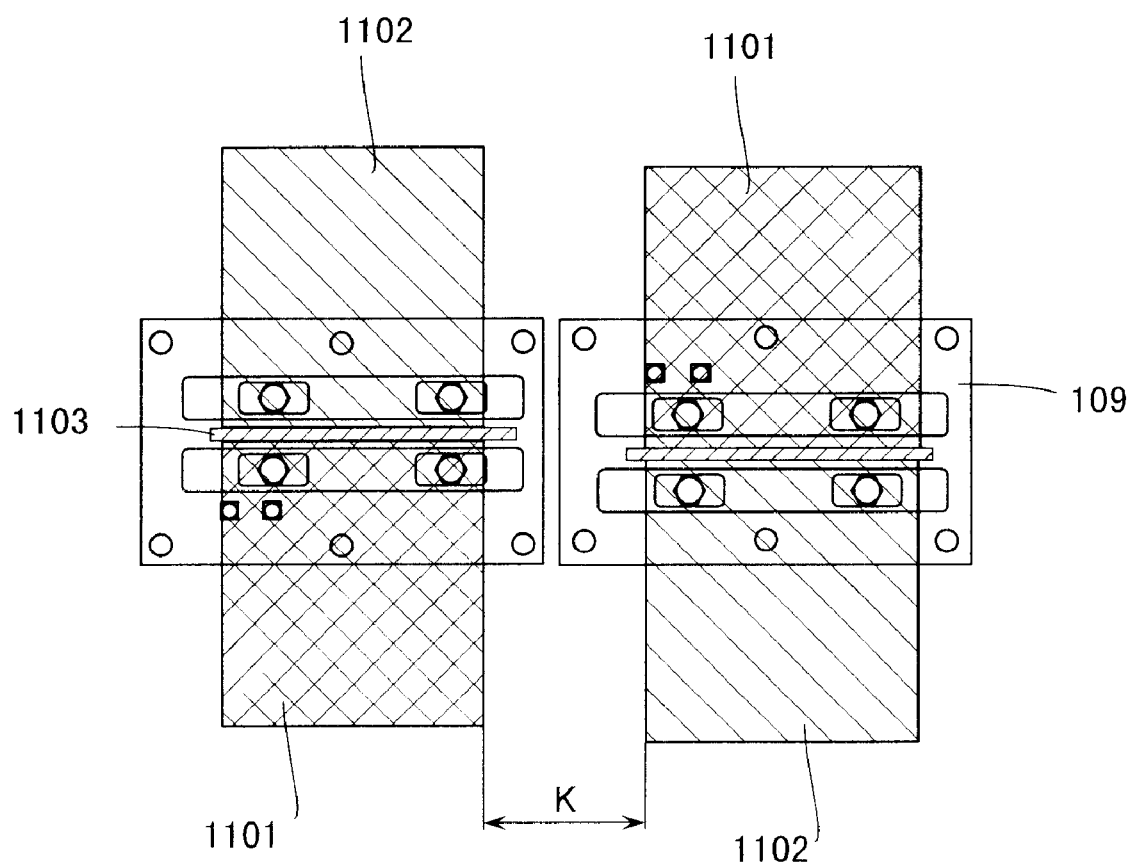
FIG. 11 is a front view showing an inverter device including the semiconductor modules of the invention.

As shown in FIG. 11, when the semiconductor modules 109 are juxtaposed, a pair of emitter bus bar 1101 and collector bus bar 1102 is connected to each of the semiconductor modules 109. In the each of the semiconductor modules 109, an electrically insulating wall 1103 is arranged between the emitter terminal surface 202 (corresponding to the emitter terminals 102a and 102b) and the collector terminal surface 211 (corresponding to the collector terminals 101a and 101b) to securely insulate the emitter bus bar 1101 and the collector bus bar 1102 from each other with a gap K of 40 mm therebetween. Since the distance A is sufficient for the electrical insulation of the emitter bus bar 1101 and the collector bus bar 1102 from the bottom surface 107a of the base 7, the emitter bus bar 1101 and the collector bus bar 1102 may extend parallel to the bottom surface 107a of the base 7. If the emitter bus bar 1101 and the collector bus bar 1102 extend parallel to each other and face closely to each other to reach respectively the emitter terminal surface and the collector terminal surface 211, a mutual inductance of the emitter bus bar 1101 and the collector bus bar 1102 decreases an inductance of the main electric circuit.

Figure 12A:
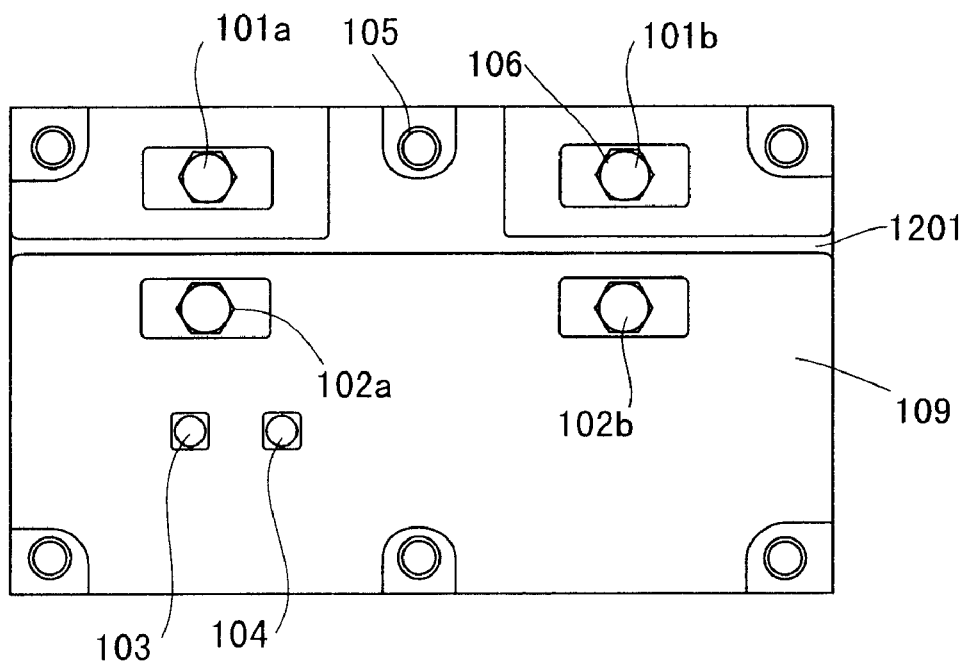
FIG. 12a is a front view showing another semiconductor module of the invention.
Figure 12B:
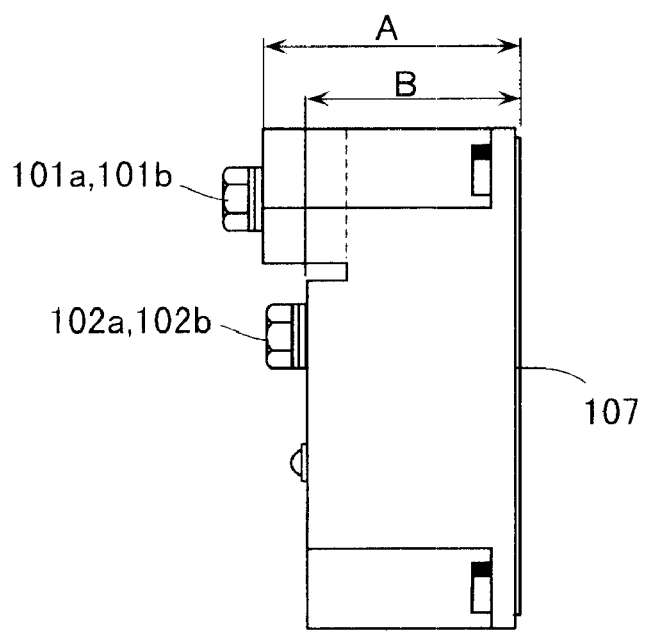
FIG. 12b is a side view showing the another semiconductor module of the invention.
Figure 13A:
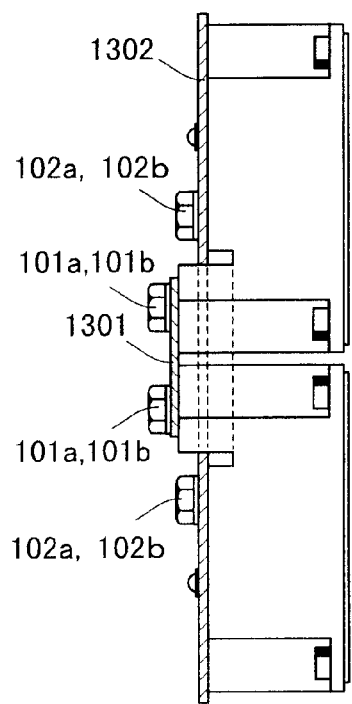
FIG. 13 is a front view showing another inverter device including the semiconductor modules of the invention.
Figure 13B:
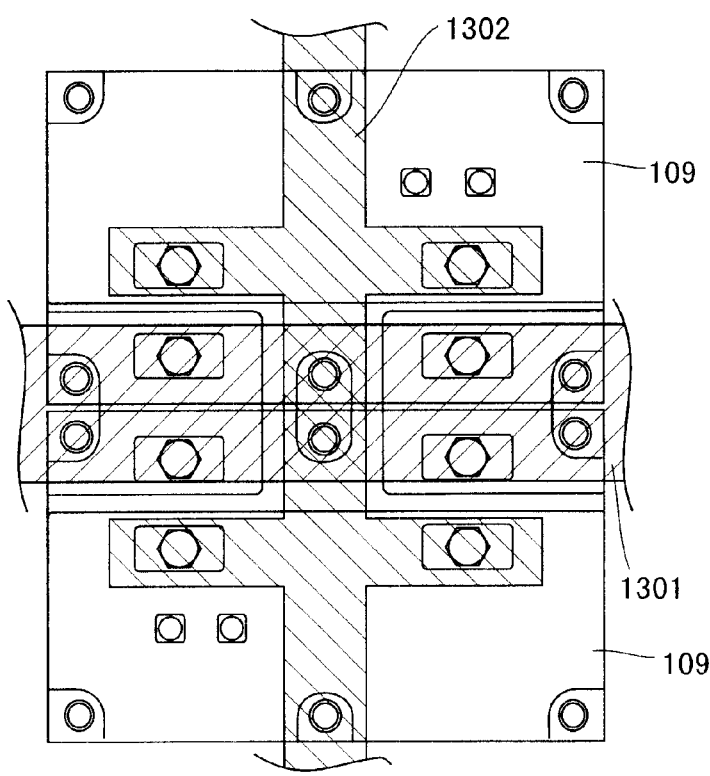

As shown in FIGS. 12a and 12b, the semiconductor module 109 may include a recess 1201, 501, 601, 801 between the collector terminals 101a and 101b and the emitter terminals 102a and 102b, and a height A of a plane on which the collector terminals 101a and 101b extend is larger than a height B (60 mm) of a plane on which the emitter supplemental terminal 103, the gate terminal 104 and the emitter terminals 102a and 102b extend and another electric element such as a gate driver (not shown) for driving the semiconductor module 109 or the like may be arranged. The height B is 80% of the height A, and a distance between each of the planes and the top of the bolts (not shown) extending from the electrically grounded cooling fin is more than the value limited by the IEC standard and the EN standard. As shown in FIGS. 13a and 13b, the semiconductor modules 109 as shown in FIGS. 12a and 12b may be juxtaposed in such a manner that pairs of the collector terminals 101a and 101b respectively on the semiconductor modules 109 are adjacent closely to each other. The pairs of the collector terminals 101a and 101b are connected to each other by a collector bus bar 1301, and the emitter terminals 102a and 102b are connected to each other by an emitter bus bar 1302 extending perpendicularly to the collector bus bar 1301 with a clearance therebetween and an electrically insulating resin plate (not shown) in the clearance. In this embodiment, a length of each of the collector bus bar 1301 and the emitter bus bar 1302 connecting the semiconductor modules 10 to each other is minimized to decrease the inductance of the main electric circuit by not less than 20%.

Figure 15A:
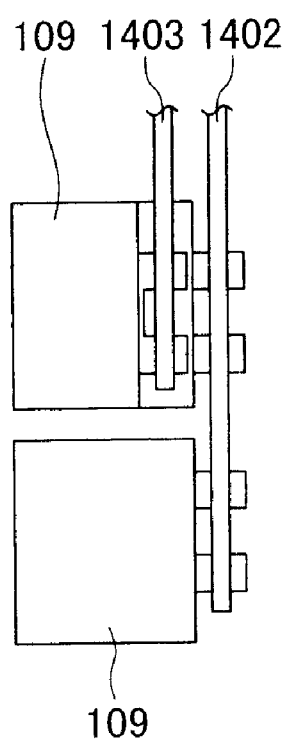
FIG. 15a is a side view of a pair of the semiconductor modules.
Figure 15B:
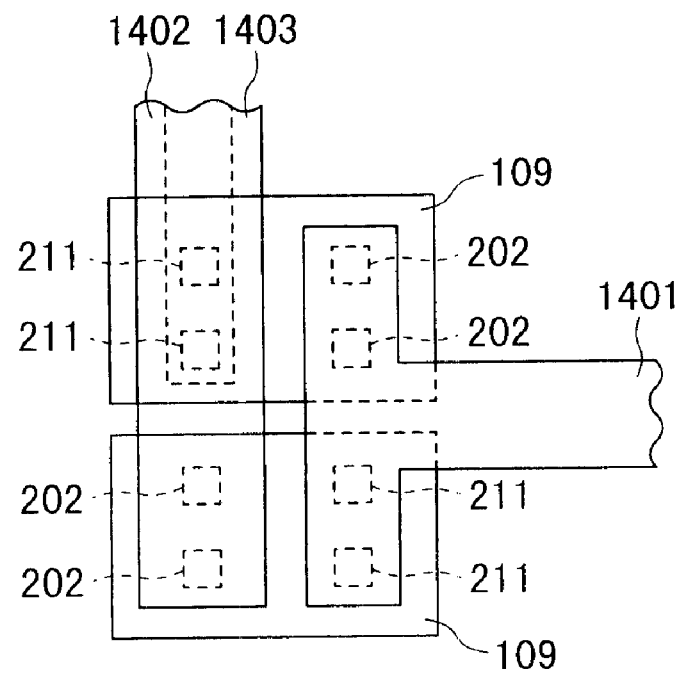
FIG. 15b is a front view of the pair of the semiconductor modules.

As shown in FIGS. 15a and 15b, in an inverter device, the first and second terminal surfaces 211 of the first semiconductor module 109 to be contacted with a bus bar 1403 and the first and second terminal surfaces 202 of the second semiconductor module to be contacted with a bus bar 1402 are arranged along a substantially straight imaginary line as seen in a direction perpendicular to the bottom surfaces, and a height between the outer surface and an imaginary plane on which the first and second terminal surfaces 211 of the first semiconductor module 109 extend is different from a height between the outer surface and another imaginary plane on which the first and second terminal surfaces 202 of the second semiconductor module extend as seen in a direction parallel to the outer surfaces.

Figure 14:
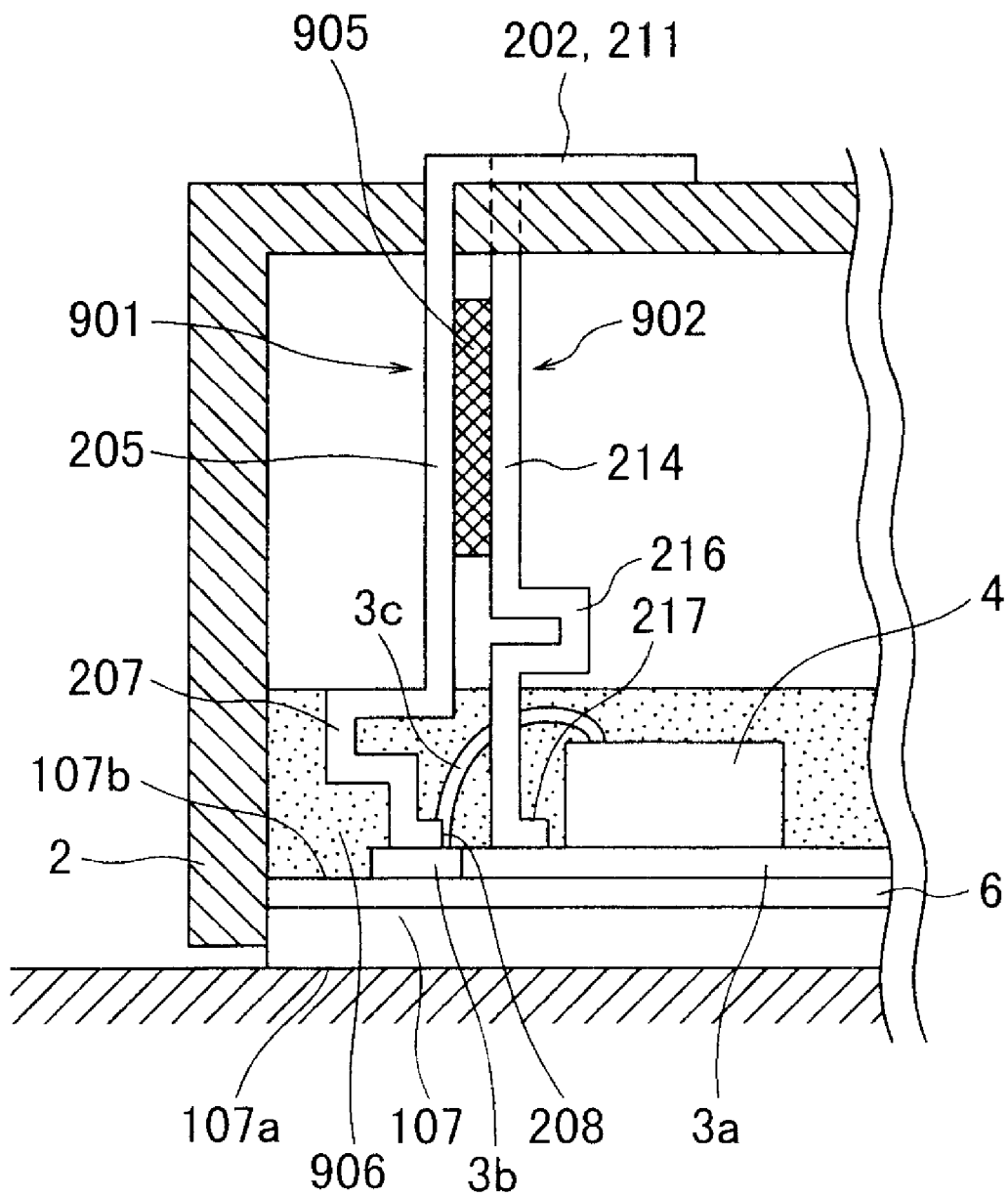
FIG. 14 is a partially cross-sectional view showing an electrically insulating base contacting with an electrically grounded surface, an electrically insulating substrate on the electrically insulating base, an electrically conductive layer on the electrically insulating ceramic substrate, a semiconductor element connected to the electrically conductive layer, first and second electrically conductive member connected to the electrically conductive layer and extending to the exterior of the module, an electrically insulating cover, a first electrically insulating spacer which is to be inserted in jelly state a space between the semiconductor element and the electrically insulating cover and to be cured between the semiconductor element and the electrically insulating cover, and a second electrically insulating spacer which is to be inserted in solid state between the first and second electrically conductive members.

As shown in FIG. 14, the bottom surface 107a of the electrically insulating base 107 contacts with the electrically grounded surface, an electrically insulating ceramic substrate 6 is mounted on the electrically insulating base 107, a collector electrically conductive layer 3a and an emitter electrically conductive layer 3b are formed on the electrically insulating ceramic substrate 6, a semiconductor element 4 is mounted on the collector electrically conductive layer 3a to electrically connect a collector terminal of the semiconductor element 4 on a bottom surface thereof to the collector electrically conductive layer 3a, an electrically conductive wire 3c connects electrically the emitter electrically conductive layer 3b to an emitter terminal of the semiconductor element 4, first and second electrically conductive member 901, 902 are connected to respectively the collector electrically conductive layer 3a and the emitter electrically conductive layer 3b and extend to the exterior of the module 109, an electrically insulating cover 2 covers the semiconductor element 4 and the electrically conductive layer 3, a first electrically insulating spacer 906 is inserted in jelly state a space between the semiconductor element 4 and the electrically insulating cover 2 and cured between the semiconductor element 4 and the electrically insulating cover 2, and a second electrically insulating spacer 905 is inserted in solid state between the first and second electrically conductive members 901, 902.

What is claimed is:

1. A semiconductor module comprising:
   a semiconductor element;
   an electrically insulating base having an outer surface to be connected to an electrically grounded surface, and an inner surface on which the semiconductor element is arranged;
   an electrically insulating cover covering the semiconductor element on the inner surface; and
   first and second electrically conductive members each of which is connected to the semiconductor element and extends to the exterior of the semiconductor module through the electrically insulating cover;
   wherein a part of each of the first and second electrically conductive members on the exterior of the semiconductor module is arranged away from the outer surface of the electrically insulating base to electrically isolate the part of the each of the first and second electrically conductive members from the electrically grounded surface; and
   a third electrically conductive member connected to the semiconductor element and extending to the exterior of the semiconductor module through the electrically insulating cover, wherein the semiconductor module is configured so that electric current is supplied to the semiconductor element, a value of electric current flowing through the third electrically conductive member is significantly smaller than a value of electric current flowing through the each of the first and second electrically conductive members, a part of the third electrically conductive member on the exterior of the semiconductor module is arranged away from the outer surface of the electrically insulating base to electrically isolate the part of the third electrically conductive member from the electrically grounded surface, and a distance between the outer surface of the electrically insulating base and the part of the third electrically conductive member is less than a distance between the outer surface of the electrically insulating base and the part of the each of the first and second electrically conductive members in a direction perpendicular to the outer surface of the electrically insulating base while being not less than 80% of the distance.

2. A semiconductor module according to claim 1, wherein a distance between the part of the third electrically conductive member and the part of the each of the first and second electrically conductive members in the direction perpendicular to the outer surface is not less than 5 mm.

3. A semiconductor module comprising:
   a semiconductor element;
   an electrically insulating base having an outer surface to be connected to an electrically grounded surface, and an inner surface on which the semiconductor element is arranged;
   an electrically insulating cover covering the semiconductor element on the inner surface; and
   first and second electrically conductive members each of which is connected to the semiconductor element and extends to the exterior of the semiconductor module through the electrically insulating cover;
   wherein a part of each of the first and second electrically conductive members on the exterior of the semiconductor module is arranged away from the outer surface of the electrically insulating base to electrically isolate the part of the each of the first and second electrically conductive members from the electrically grounded surface; and
   a first electrically insulating spacer inserted in jelly-state into a space between the semiconductor element and the electrically insulating cover and cured between the semiconductor element and the electrically insulating cover, and a second electrically insulating spacer inserted in solid-state between areas of the first and second electrically conductive members facing close to each other to form a mutual inductance therebetween.

4. A semiconductor module comprising:
   a semiconductor element;
   an electrically insulating base having an outer surface to be connected to an electrically grounded surface, and an inner surface on which the semiconductor element is arranged;
   an electrically insulating cover covering the semiconductor element on the inner surface; and
   first and second electrically conductive members each of which is connected to the semiconductor element and extends to the exterior of the semiconductor module through the electrically insulating cover;
   wherein a part of each of the first and second electrically conductive members on the exterior of the semiconductor module is arranged away from the outer surface of the electrically insulating base to electrically isolate the part of the each of the first and second electrically conductive members from the electrically grounded surface; and
   wherein at least one of the first and second electrically conductive members includes a first bent portion, a second bent portion and a third bent portion arranged in series while the second bent portion is arranged between the first and third bent portions in a current flow direction in which an electric current flows when the electric current is supplied to the semiconductor element, the first, second and third bent portions are bent around respective axes parallel to each other and perpendicular to a thickness direction of the at least one of the first and second electrically conductive members at the first, second and third bent portions, and a portion of the at least one of the first and second electrically conductive members between the first and third bent portion is prevented from contacting with the electrically insulating cover.

5. A semiconductor module comprising:
   a semiconductor element;
   an electrically insulating base having an outer surface to be connected to an electrically grounded surface, and an inner surface on which the semiconductor element is arranged;
   an electrically insulating cover covering the semiconductor element on the inner surface; and
   first and second electrically conductive members each of which is connected to the semiconductor element and extends to the exterior of the semiconductor module through the electrically insulating cover;
   wherein a part of each of the first and second electrically conductive members on the exterior of the semiconductor module is arranged away from the outer surface of the electrically insulating base to electrically isolate the part of the each of the first and second electrically conductive members from the electrically grounded surface;
   wherein when an electric current is supplied to the semiconductor element through the first electrically conductive member, at least a part of the electric current is output from the semiconductor module through the second electrically conductive member, and the first and second electrically conductive members are arranged close to each other to form a mutual inductance therebetween;

wherein the first and second electrically conductive members have respective relatively-wide portions facing close to each other, and a directional component of electric current in one of the relatively-wide portions is opposite to another directional component of electric current in another one of the relatively-wide portions;

wherein the first and second electrically conductive members have respective relatively-narrow portions adjacent to the relatively-wide portions, and a cross- sectional area of each of the relatively-wide portions is larger than that of each of the relatively-narrow portions as seen in a current flow direction in which the electric current flows to concentrate the electric current to areas of the relatively-wide portions adjacent to the relatively-narrow portions;

wherein at least one of the first and second electrically conductive members is bent at the relatively-narrow portion around an axis perpendicular to a thickness direction of the at least one of the first and second electrically conductive members at the relatively-narrow portion; and wherein the at least one of the first and second electrically conductive members has at least two connecting feet each of which projects divergently from the relatively-narrow portion and is connected to the semiconductor element.

6. A semiconductor module according to claim 5, wherein the at least two connecting feet adjacent to the relatively-narrow portions extend substantially parallel to the part of each of the first and second electrically conductive members on the exterior of the semiconductor module.

7. A semiconductor module comprising:

a semiconductor element;

an electrically insulating base having an outer surface to be connected to an electrically grounded surface, and an inner surface on which the semiconductor element is arranged;

an electrically insulating cover covering the semiconductor element on the inner surface; and first and second electrically conductive members each of which is connected to the semiconductor element and extends to the exterior of the semiconductor module through the electrically insulating cover;

wherein a part of each of the first and second electrically conductive members on the exterior of the semiconductor module is arranged away from the outer surface of the electrically insulating base to electrically isolate the part of the each of the first and second electrically conductive members from the electrically grounded surface;

wherein when an electric current is supplied to the semiconductor element through the first electrically conductive member, at least a part of the electric current is output from the semiconductor module through the second electrically conductive member, and the first and second electrically conductive members are arranged close to each other to form a mutual inductance therebetween;

wherein the first and second electrically conductive members have respective relatively-wide portions facing close to each other, and a directional component of electric current in one of the relatively-wide portions is opposite to another directional component of electric current in another one of the relatively-wide portions;

wherein the first and second electrically conductive members have respective relatively-narrow portions adjacent to the relatively-wide portions, and a cross- sectional area of each of the relatively-wide portions is larger than that of each of the relatively-narrow portions as seen in a current flow direction in which the electric current flows to concentrate the electric current to areas of the relatively-wide portions adjacent to the relatively-narrow portions; and wherein a flowing direction of the electric current is bent by the relatively-narrow portion of at least one of the first and second electrically conductive members to increase a length of electric current path between the part of the at least one of the first and second electrically conductive members and the semiconductor element and to make the flowing direction of electric current from the relatively-narrow portion and the flowing direction of electric current to the relatively-narrow portion opposite to each other.

8. A semiconductor module comprising:

a semiconductor element;

an electrically insulating base having an outer surface to be connected to an electrically grounded surface, and an inner surface on which the semiconductor element is arranged;

an electrically insulating cover covering the semiconductor element on the inner surface; and first and second electrically conductive members each of which is connected to the semiconductor element and extends to the exterior of the semiconductor module through the electrically insulating cover;

wherein a part of each of the first and second electrically conductive members on the exterior of the semiconductor module is arranged away from the outer surface of the electrically insulating base to electrically isolate the part of the each of the first and second electrically conductive members from the electrically grounded surface;

wherein when an electric current is supplied to the semiconductor element through the first electrically conductive member, at least a part of the electric current is output from the semiconductor module through the second electrically conductive member, and the first and second electrically conductive members are arranged close to each other to form a mutual inductance therebetween;

wherein the first and second electrically conductive members have respective relatively-wide portions facing close to each other, and a directional component of electric current in one of the relatively-wide portions is opposite to another directional component of electric current in another one of the relatively-wide portions; and wherein, as seen in a direction perpendicular to the outer surface of the electrically insulating base, the relatively-wide portions face to each other in a direction substantially perpendicular to an imaginary line extending between the parts of the first and second electrically conductive members on the exterior of the semiconductor module.

9. A semiconductor module comprising:

a semiconductor element;

an electrically insulating base having an outer surface to be connected to an electrically grounded surface, and an inner surface on which the semiconductor element is arranged;

an electrically insulating cover covering the semiconductor element on the inner surface; and first and second electrically conductive members each of which is connected to the semiconductor element and extends to the exterior of the semiconductor module through the electrically insulating cover;

wherein a part of each of the first and second electrically conductive members on the exterior of the semiconductor module is arranged away from the outer surface of the electrically insulating base to electrically isolate the part of the each of the first and second electrically conductive members from the electrically grounded surface;

wherein when an electric current is supplied to the semiconductor element through the first electrically conductive member, at least a part of the electric current is output from the semiconductor module through the second electrically conductive member, and the first and second electrically conductive members are arranged close to each other to form a mutual inductance therebetween;

wherein the first and second electrically conductive members have respective relatively-wide portions facing close to each other, and a directional component of electric current in one of the relatively-wide portions is opposite to another directional component of electric current in another one of the relatively-wide portions; and wherein both of the first and second electrically conductive members extend from the exterior of the semiconductor module toward the relatively-wide portions to flow respective electric currents obliquely to a direction perpendicular to the outer surface of the electrically insulating base between the exterior of the semiconductor module and the relatively-wide portions.

10. A semiconductor module comprising:

a semiconductor element;

an electrically insulating base having an outer surface to be connected to an electrically grounded surface, and an inner surface on which the semiconductor element is arranged;

an electrically insulating cover covering the semiconductor element on the inner surface; and first and second electrically conductive members each of which is connected to the semiconductor element and extends to the exterior of the semiconductor module through the electrically insulating cover;

wherein a part of each of the first and second electrically conductive members on the exterior of the semiconductor module is arranged away from the outer surface of the electrically insulating base to electrically isolate the part of the each of the first and second electrically conductive members from the electrically grounded surface; and a third electrically conductive member connected to the semiconductor element and extending to the exterior of the semiconductor module through the electrically insulating cover, wherein the semiconductor module is configured so that when electric current is supplied to the semiconductor element, a value of electric current flowing through the third electrically conductive member is significantly smaller than a value of electric current flowing through the each of the first and second electrically conductive members, a part of the third electrically conductive member on the exterior of the semiconductor module is arranged away from the outer surface of the electrically insulating base to electrically isolate the part of the third electrically conductive member from the electrically grounded surface, and a distance between the outer surface of the electrically insulating base and the part of each of the first and third electrically conductive members is less than a distance between the outer surface of the electrically insulating base and the part the second electrically conductive members in a direction perpendicular to the outer surface of the electrically insulating base.

11. A semiconductor module comprising:

a semiconductor element;

an electrically insulating base having an outer surface to be connected to an electrically grounded surface, and an inner surface on which the semiconductor element is arranged;

an electrically insulating cover covering the semiconductor element on the inner surface; and first and second electrically conductive members each of which is connected to the semiconductor element and extends to the exterior of the semiconductor module through the electrically insulating cover;

wherein a part of each of the first and second electrically conductive members on the exterior of the semiconductor module is arranged away from the outer surface of the electrically insulating base to electrically isolate the part of the each of the first and second electrically conductive members from the electrically grounded surface;

wherein when an electric current is supplied to the semiconductor element through the first electrically conductive member, at least a part of the electric current is output from the semiconductor module through the second electrically conductive member, and the first and second electrically conductive members are arranged close to each other to form a mutual inductance therebetween;

wherein the first and second electrically conductive members have respective relatively-wide portions facing close to each other, and a directional component of electric current in one of the relatively-wide portions is opposite to another directional component of electric current in another one of the relatively-wide portions; and wherein one of the relatively-wide portions is bent to partially surround partially another one of the relatively-wide portions.

12. An inverter device comprising a pair of first and second semiconductor modules each comprising:

a semiconductor element;

an electrically insulating base having an outer surface to be connected to an electrically grounded surface, and an inner surface on which the semiconductor element is arranged;

an electrically insulating cover covering the semiconductor element on the inner surface; and first and second terminal surfaces on an exterior of the semiconductor module disposed so as to be contacted with a bus bar to form an electric communication between the semiconductor element and the bus bar;

wherein when an electric current flows into the first and second terminal surfaces of the first semiconductor module from one of the bus bars, at least a part of the electric current flows out of the first and second terminal surfaces of the second semiconductor module into another one of the bus bars, the first and second terminal surfaces of the first semiconductor module and the first and second terminal surfaces of the second semiconductor module are arranged along a substantially straight imaginary line as seen in a direction perpendicular to the outer surface of the electrically insulating base, and a height between the outer surface of the electrically insulating base and an imaginary plane on which the first and second terminal surfaces of the first semiconductor module extend is different from a height between the outer surface of the electrically insulating base and another imaginary plane on which the first and second terminal surfaces of the second semiconductor module extend as seen in a direction parallel to the outer surface of the electrically insulating base.

* * * * *